US006441663B1

United States Patent
Chuang et al.

(10) Patent No.: US 6,441,663 B1
(45) Date of Patent: Aug. 27, 2002

(54) SOI CMOS SCHMITT TRIGGER CIRCUITS WITH CONTROLLABLE HYSTERESIS

(75) Inventors: Ching-Te Kent Chuang, South Salem, NY (US); Jente Benedict Kuang, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/704,436

(22) Filed: Nov. 2, 2000

(51) Int. Cl.[7] .......................... H03K 3/037; H03K 3/01

(52) U.S. Cl. ....................................... 327/206; 327/537

(58) Field of Search ................................. 327/205, 206, 327/534, 537

(56) References Cited

U.S. PATENT DOCUMENTS

| | | | | |
|---|---|---|---|---|
| 4,563,594 A | * | 1/1986 | Koyama ..................... | 327/206 |
| 5,175,445 A | * | 12/1992 | Kinugasa et al. ........... | 327/206 |
| 6,037,808 A | * | 3/2000 | Houston et al. ............ | 327/534 |
| 6,049,230 A | * | 4/2000 | Durham et al. ............. | 327/534 |
| 6,124,733 A | * | 9/2000 | Sharpe-Geisler ............ | 327/108 |
| 6,133,772 A | * | 10/2000 | Drapkin et al. ............. | 327/205 |

* cited by examiner

Primary Examiner—Toan Tran
(74) Attorney, Agent, or Firm—Joan Pennington

(57) ABSTRACT

A silicon-on-insulator (SOI) complementary metal oxide semiconductor (CMOS) Schmitt trigger circuit with controllable hysteresis and a method are provided for adapting a CMOS Schmitt trigger circuit for deep sub-micrometer partially depleted SOI (PD/SOI) applications. A SOI CMOS Schmitt trigger circuit with controllable hysteresis includes a stack of a plurality of field effect transistors (FETs) connected in series between a voltage supply and ground. An input is applied to a gate of each of the stack of the plurality of field effect transistors (FETs). The stack of the plurality of field effect transistors (FETs) provides an output at a junction of a predetermined pair of the plurality of field effect transistors (FETs). At least one feedback field effect transistor (FET) has a source coupled a junction of a predefined pair of the stack of field effect transistors (FETs) and has a gate coupled to the output. A FET body of each of the stack of the plurality of field effect transistors (FETs) is connected to a voltage supply rail. The stack of the plurality of field effect transistors (FETs) includes a plurality of P-channel field effect transistors (PFETs) and a plurality of N-channel field effect transistors (NFETs). The FET body of each of the plurality of P-channel field effect transistors (PFETs) is connected to a positive voltage supply rail and the FET body of each of the plurality of N-channel field effect transistors (NFETs) is connected to a voltage supply ground rail. The FET body of a P-channel feedback field effect transistor (PFET) is connected to one of a positive voltage supply rail, the gate or the source of the feedback PFET. The FET body of a N-channel feedback field effect transistor (NFET) is connected to one of a voltage supply ground rail, the gate or the source of the feedback NFET. A successive switching threshold adjustment technique is provided. Additional successive switching threshold adjustment is achieved by successive tapping of NFET or PFET feedback devices for the $V^+$ or the $V^-$ trigger edges, respectively. With this arrangement, higher $V^+$ and lower $V^-$ are realized without using excessively wide NFET or PFET feedback devices.

20 Claims, 17 Drawing Sheets

SOI CMOS SCHMITT TRIGGER CIRCUITS WITH CONTROLLABLE HYSTERESIS

FIELD OF THE INVENTION

The present invention relates silicon-on-insulator (SOI) complementary metal oxide semiconductor (CMOS) Schmitt trigger circuits with controllable hysteresis and a method for adapting a CMOS Schmitt trigger circuit for deep sub-micrometer partially depleted SOI (PD/SOI) applications.

DESCRIPTION OF THE RELATED ART

High performance deep sub-micrometer SOI designs are vulnerable to increased noises from line-to-line capacitance coupling as a result of technology scaling. To restore signal integrity, judicious use of Schmitt trigger receivers can serve as a convenient and transparent solution. The Schmitt trigger is often used to turn a signal with a very slow or sloppy transition into a signal with a sharp transition.

Referring to FIGS. 1, 2A and 2B, in FIG. 1, an unmodified inverting Schmitt trigger circuit is shown. FIGS. 2A and 2B illustrate quasi-static transfer characteristics of an unmodified SOI CMOS Schmitt trigger circuit with all the FET bodies left floating. FIGS. 2A and 2B illustrate transfer curves that are generated under slow input signal slews and long cycle time. The first 500 simulation cycles are shown when the circuit is activated from dormancy. Due to the history effect associated with floating body voltages of the 6 component field effect transistors (FETs) in the unmodified inverting Schmitt trigger circuit, the switching trip points $V^+$ and $V^-$ suffer a wide degree of uncertainty. In turn, it makes $\Delta V = V^+ - V^-$ vary, depending on exact FET body potentials, from one quasi-static sweep to another even when the input voltage scans at a consistently low frequency, mimicking the DC transfer curve. Examples are shown in FIGS. 2A and 2B, where low-frequency input signals, namely 2.5 MHz squared sine waves, are applied to construct the transfer characteristics for the first 500 hundred cycles after a prolonged circuit dormancy. For a bulk CMOS circuit, the low-frequency sweep and its corresponding transfer curve, represent the quasi-static behavior. However, for a floating-body PD/SOI CMOS circuit, due to the dependence of body voltages on the initial condition and operating history of the circuit, the so-called quasi-static transfer characteristics will not be unique and jitters or variations will be present. Thus, the low-frequency sweep unambiguously captures any floating-body-induced hysteresis in the PD/SOI design.

In FIG. 2A, the $\Delta V$ varies from about 310 mV to 420 mV. The example of FIG. 2A is not the worst case in PD/SOI. In particular, a wide 80 mV uncertainty for the $V^+$ edge is observed, which is caused primarily by the gradual threshold voltage drift of NFET N3. Depending on the initial conditions and device sizes, the eye of the transfer curve grows larger or smaller as the cycle proceeds without a controllable or predictable trend. This is exemplified by the marked difference between FIGS. 2A and 2B. In FIG. 2B, the input sweep sequence is reversed from that of FIG. 2A to create a different set of initial conditions for body voltages. Faster sweep, varying duty cycles, extreme fabrication and operating conditions can create more $V^+$, $V^-$, and $\Delta V$ variation even to the extent that the circuit is no longer able to function within the allowable noise margin specificiation.

A need exists for SOI CMOS Schmitt trigger circuits with controllable hysteresis and a method for adapting a CMOS Schmitt trigger circuit for deep sub-micrometer partially depleted SOI (PD/SOI) applications.

SUMMARY OF THE INVENTION

A principal object of the present invention is to provide a SOI CMOS Schmitt trigger circuit with controllable hysteresis and a method for adapting a CMOS Schmitt trigger circuit for deep sub-micrometer partially depleted SOI (PD/SOI) applications. Other important objects of the present invention are to provide such SOI CMOS Schmitt trigger circuit with controllable hysteresis and method substantially without negative effect and that overcome many of the disadvantages of prior art arrangements.

In brief, a silicon-on-insulator (SOI) complementary metal oxide semiconductor (CMOS) Schmitt trigger circuit with controllable hysteresis and a method are provided for adapting a CMOS Schmitt trigger circuit for deep sub-micrometer partially depleted SOI (PD/SOI) applications. A SOI CMOS Schmitt trigger circuit with controllable hysteresis includes a stack of a plurality of field effect transistors (FETs) connected in series between a voltage supply and ground. An input is applied to a gate of each of the stack of the plurality of field effect transistors (FETs). The stack of the plurality of field effect transistors (FETs) provides an output at a junction of a predetermined pair of the plurality of field effect transistors (FETs). At least one feedback field effect transistor (FET) has a source coupled a junction of a predefined pair of the stack of field effect transistors (FETs) and has a gate coupled to the output. A FET body of each of the stack of the plurality of field effect transistors (FETs) is connected to a voltage supply rail.

In accordance with features of the invention, the stack of the plurality of field effect transistors (FETs) includes a plurality of P-channel field effect transistors (PFETs) and a plurality of N-channel field effect transistors (NFETs). The FET body of each of the plurality of P-channel field effect transistors (PFETs) is connected to a positive voltage supply rail and the FET body of each of the plurality of N-channel field effect transistors (NFETs) is connected to a voltage supply ground rail. The FET body of a P-channel feedback field effect transistor (PFET) is connected to one of a positive voltage supply rail, the gate or the source of the feedback PFET. The FET body of a N-channel feedback field effect transistor (NFET) is connected to one of a voltage supply ground rail, the gate or the source of the feedback NFET. A successive switching threshold adjustment technique is provided. Additional successive switching threshold adjustment is achieved by successive tapping of NFET or PFET feedback devices for the $V^+$ or the $V^-$ trigger edges, respectively. With this arrangement, higher $V^+$ and lower $V^-$ are realized without using excessively wide NFET or PFET feedback devices.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 3A:
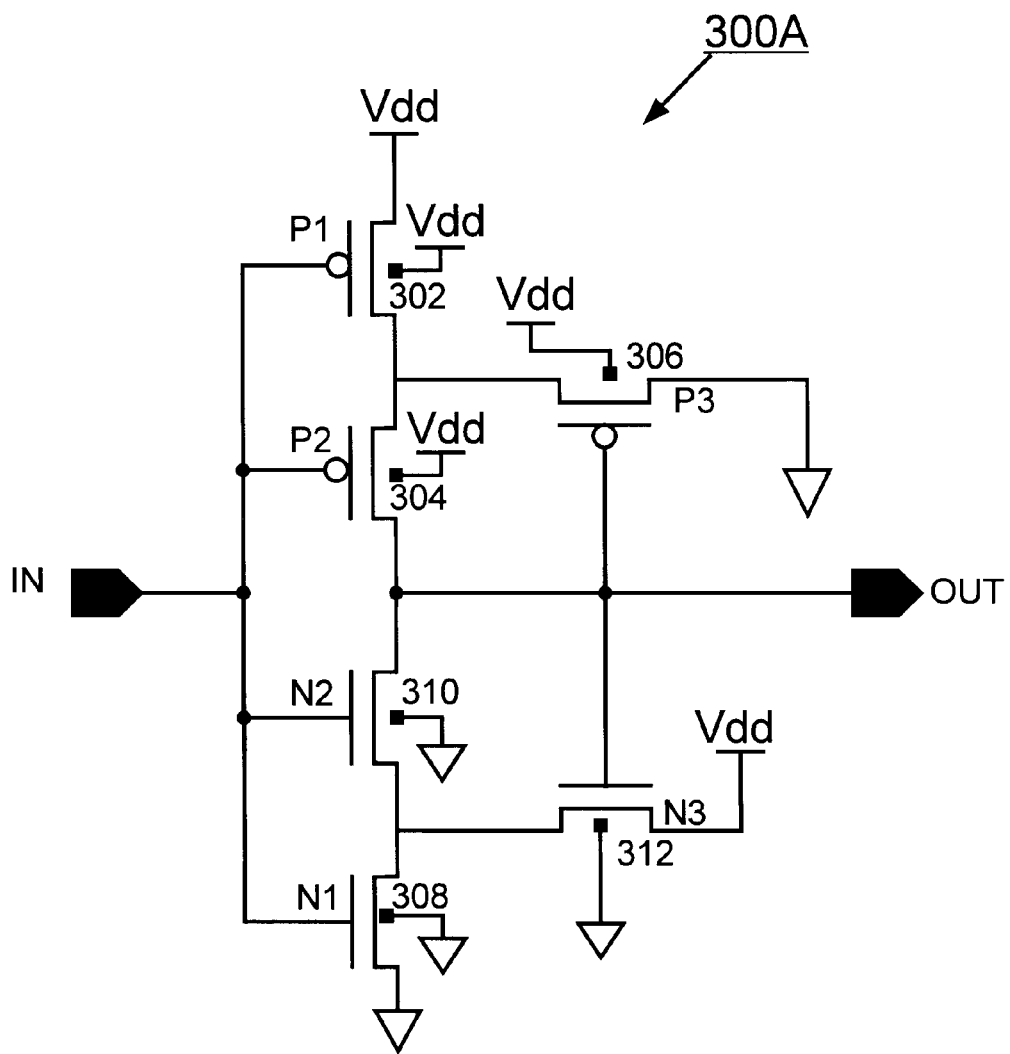
FIG. 3A is a schematic diagram representation illustrating an exemplary SOI CMOS Schmitt trigger circuit with all the NFET bodies coupled to ground and all the PFET bodies coupled to a positive supply voltage rail in accordance with the preferred embodiment.
Figure 3B:
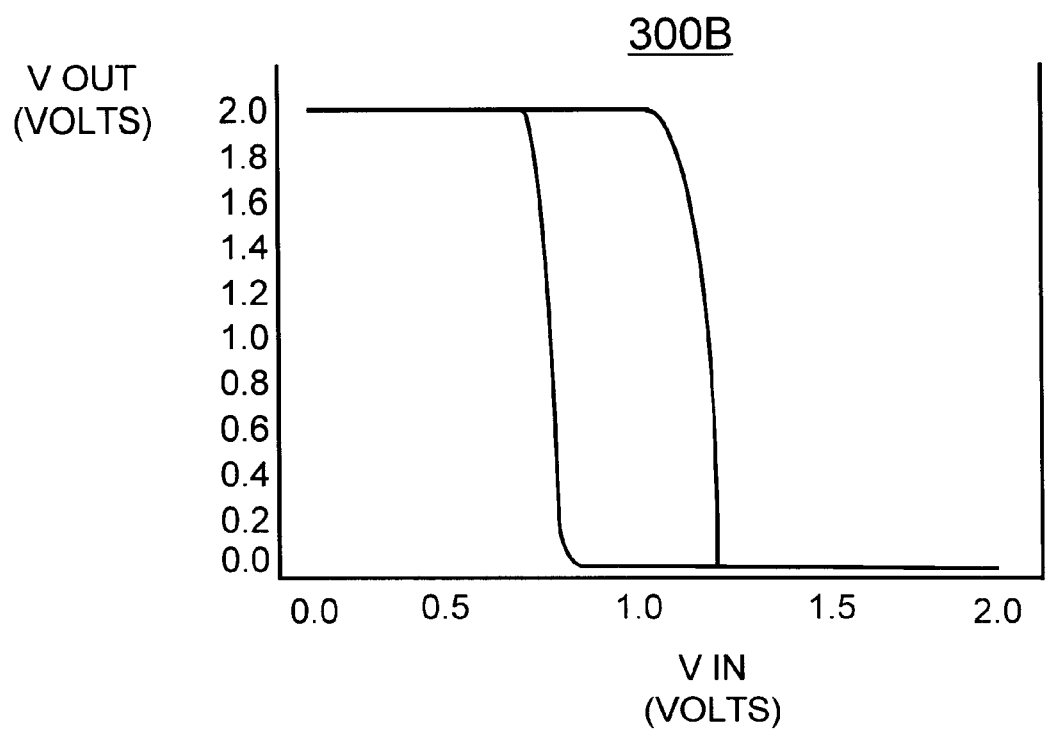
FIG. 3B is a diagram illustrating exemplary quasi-static transfer characteristics of the SOI CMOS Schmitt trigger circuit of FIG. 3A in accordance with the preferred embodiment.

Having reference now to the drawings FIGS. 3A and 3B, FIG. 3A shows a SOI CMOS Schmitt trigger circuit generally designated by the reference character 300A in accordance with the preferred embodiment. SOI CMOS Schmitt trigger circuit 300A includes a plurality of P-channel field effect transistors (PFETs) P1, P2, P3; 302, 304, 306 and a plurality of N-channel field effect transistors (NFETs) N1, N2, N3; 308, 310, 312. PFETs P1, P2; 302, 304 are connected between a supply voltage Vdd and an output labeled OUT. NFETs N1, N2; 308, 310 are connected between a ground potential and OUT. An input signal labeled IN is applied to the gate of each of the PFETs P1, P2; 302, 304 and NFETs N1, N2; 308, 310. Feedback device PFET P3, 306 is connected between the junction of series-connected PFETs P1, P2; 302, 304 and ground. Feedback device NFET N3, 312 is connected between the junction of series-connected NFETs N1, N2; 308, 310 and the supply voltage Vdd. The output signal OUT is applied to the gate of the PFET P3, 306 and of the NFET N3, 312. In SOI CMOS Schmitt trigger circuit 300A, all P-channel field effect transistor (PFET) bodies of PFETs P1, P2, P3; 302, 304, 306 are coupled to the positive supply voltage rail Vdd and all the N-channel field effect transistor (NFET) bodies N1, N2, N3; 308, 310, 312 are coupled to ground in accordance with the preferred embodiment.

Figure 1:
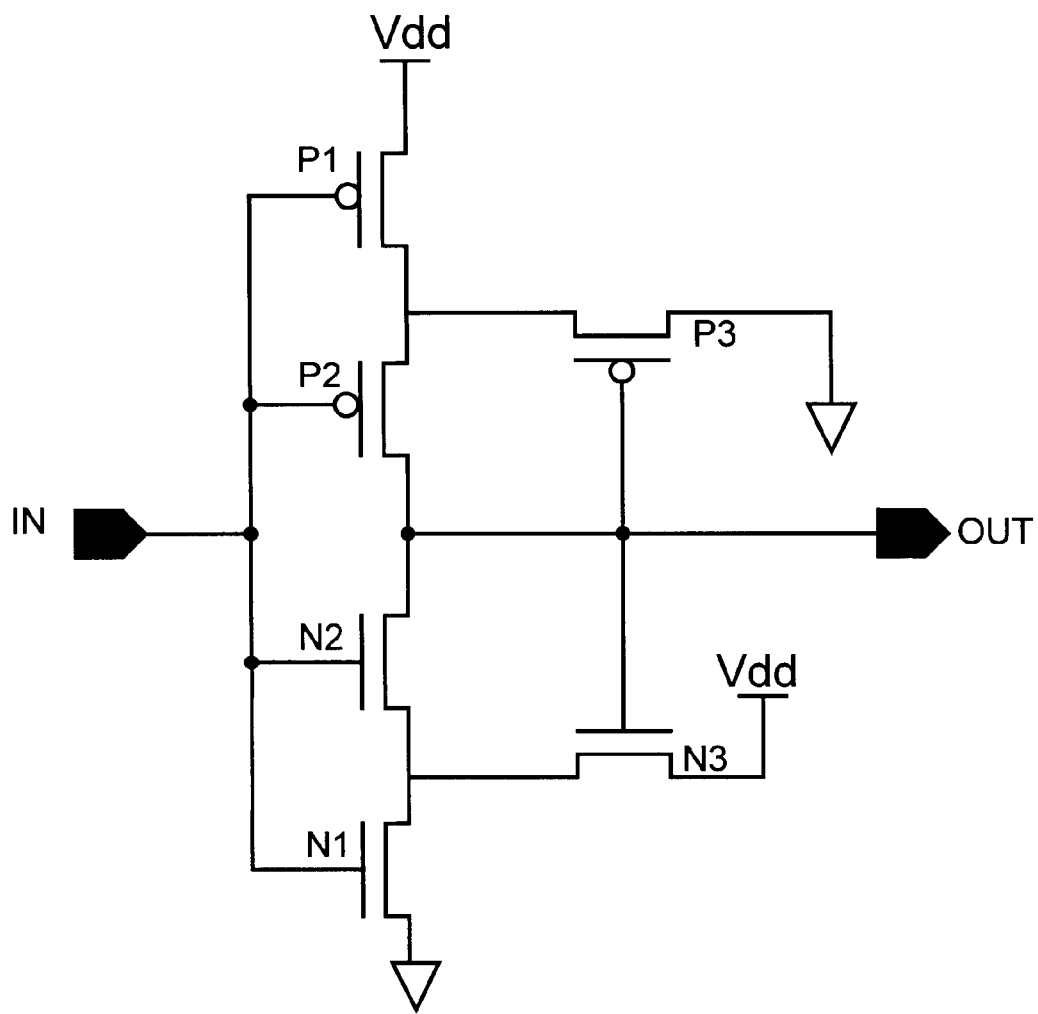
FIG. 1 is a schematic diagram representation illustrating a conventional unmodified inverting SOI CMOS Schmitt trigger circuit.
Figure 2A:
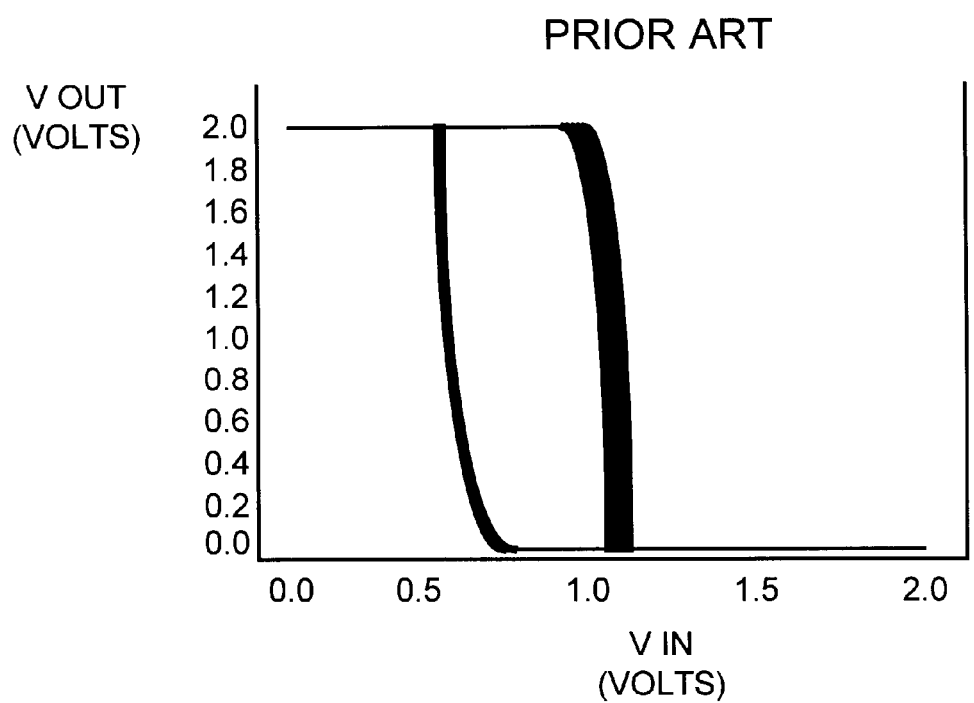
FIGS. 2A and 2B illustrate quasi-static transfer characteristics of an unmodified SOI CMOS Schmitt trigger circuit of FIG. 1 with all the FET bodies left floating.
Figure 2B:
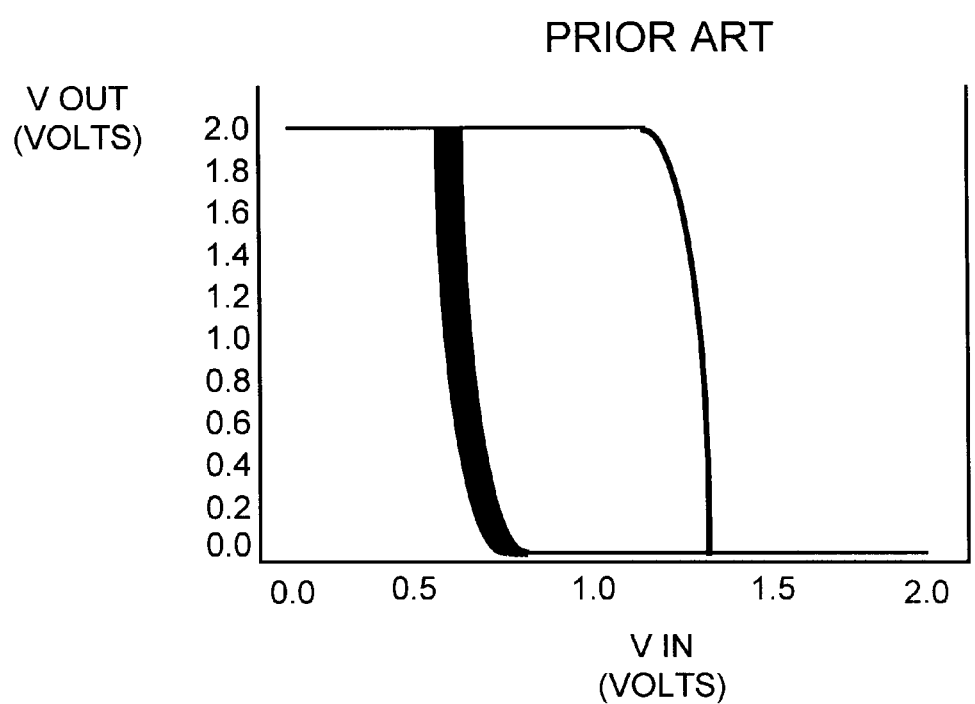

FIG. 3B illustrates exemplary quasi-static transfer characteristics generally designated by the reference character 300B for the SOI CMOS Schmitt trigger circuit 300A. In a bistable SOI CMOS Schmitt trigger circuit, each FET floating body needs to be individually addressed. One easy solution is to attach all the floating bodies to a voltage rail at the expense of ΔV compromise and layout area penalty as shown in FIG. 3A; to provide the exemplary quasi-static transfer characteristics 300B of FIG. 3B. More specifically, the bodies of the NFETs are coupled to a ground rail and the bodies of the PFETs are coupled to a high voltage supply rail. The transfer curves 300B of FIG. 3B are generated using slow input signals as done for FIGS. 2A and 2B. In FIG. 3B, the first 500 simulation cycles are shown when the SOI CMOS Schmitt trigger circuit 300A is activated from dormancy. In FIG. 3B, a resulting ΔV of 460 mV is provided. Notice that the cycle-to-cycle jitter for both V+ and V− trigger edges are significantly reduced, as compared to the illustrated quasi-static transfer characteristics of both FIGS. 2A and 2B.

In accordance with features of the preferred embodiments, the effect of threshold voltages with respect to individual devices, PFETs P1, P2, P3; and NFETs N1, N2, N3 of SOI CMOS Schmitt trigger circuits can be described as follows. Higher threshold voltages Vt's for FET N1 and N2 make V+ higher. Lower threshold voltage Vt for FET N3 makes V+ higher. Higher threshold voltages Vt's for FET P1 and P2 make V− lower. Lower threshold voltage Vt for FET P3 makes V− lower. Thus, it is advantageous to connect the bodies of NFETs N1, N2 to ground and to connect the bodies of P1 and P2 to the voltage supply Vdd in order to separate V+ and V−.

Figure 4A:
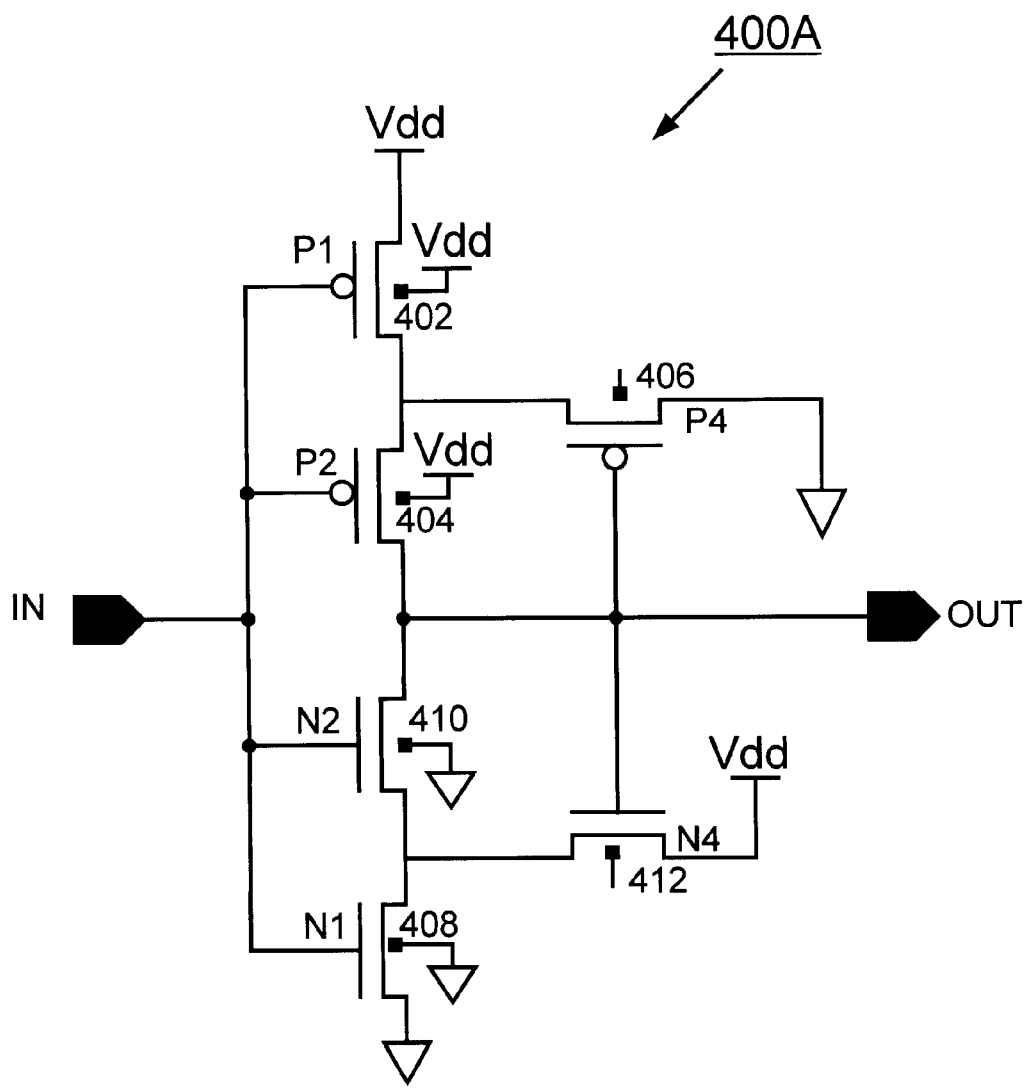
FIG. 4A is a schematic diagram representation illustrating an exemplary SOI CMOS Schmitt trigger circuit with some FET bodies coupled to ground, some FET bodies coupled to a positive voltage supply and some FET bodies left floating in accordance with the preferred embodiment.
Figure 4B:
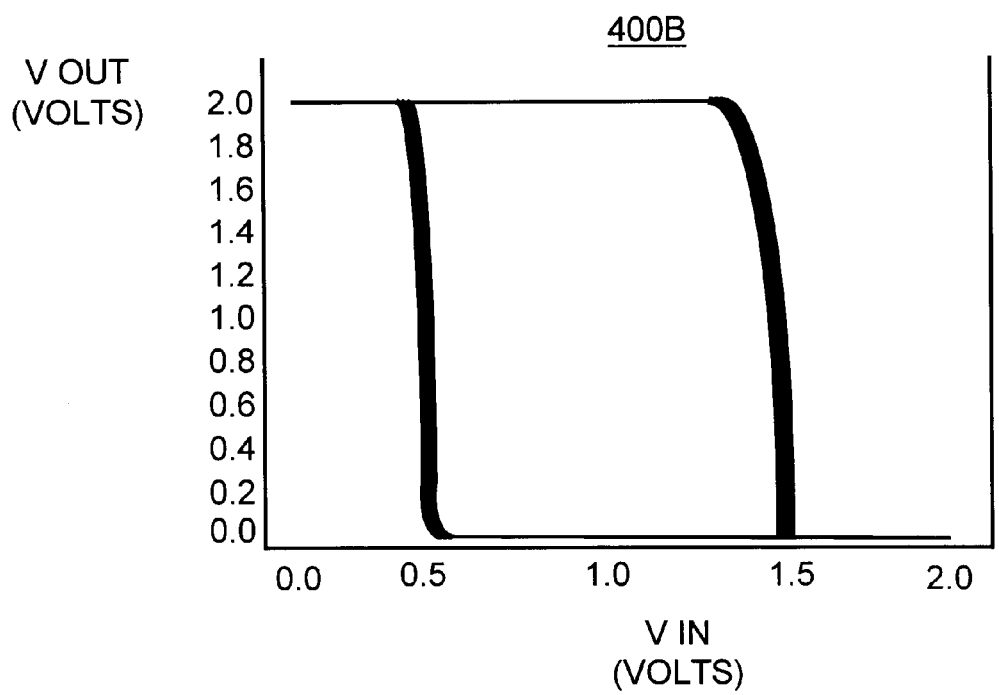
FIG. 4B is a diagram illustrating exemplary quasi-static transfer characteristics of the SOI CMOS Schmitt trigger circuit of FIG. 4A in accordance with the preferred embodiment.

Referring to FIGS. 4A and 4B, FIG. 4A shows another SOI CMOS Schmitt trigger circuit generally designated by the reference character 400A in accordance with the preferred embodiment. SOI CMOS Schmitt trigger circuit 400A includes a plurality of PFETs P1, P2, P3; 402, 404, 406 and a plurality of NFETs N1, N2, N3; 408, 410, 412. In SOI CMOS Schmitt trigger circuit 400A, FET bodies of NFETs N1, N2; 408, 410 are coupled to ground, some FET bodies of PFETs P1, P2, 402, 404 are coupled to a positive voltage supply Vdd and FET bodies of NFET N3, 412 and PFET P3, 406 are left floating. FIG. 4B illustrates an exemplary quasi-static transfer characteristics generally designated by the reference character 400B of the SOI CMOS Schmitt trigger circuit 400A. In FIG. 4B, the first 500 simulation cycles are shown when the SOI CMOS Schmitt trigger circuit 400A is activated from dormancy. In FIG. 4B, a resulting ΔV of 980 mV is provided. Notice that the cycle-to-cycle jitter for both V+ and V− trigger edges are significantly increased, as compared to the illustrated quasi-static transfer characteristics of FIG. 3B. It can be seen that it is advantageous to connect the bodies of NFETS N1, N2 408, 410 to ground, and of PFETS P1, P2 402, 404 to Vdd in order to separate V⁺ and V⁻. However, this alone is not sufficient to significantly minimize the cycle-to-cycle variation as shown in FIG. 4B.

Figure 5A:
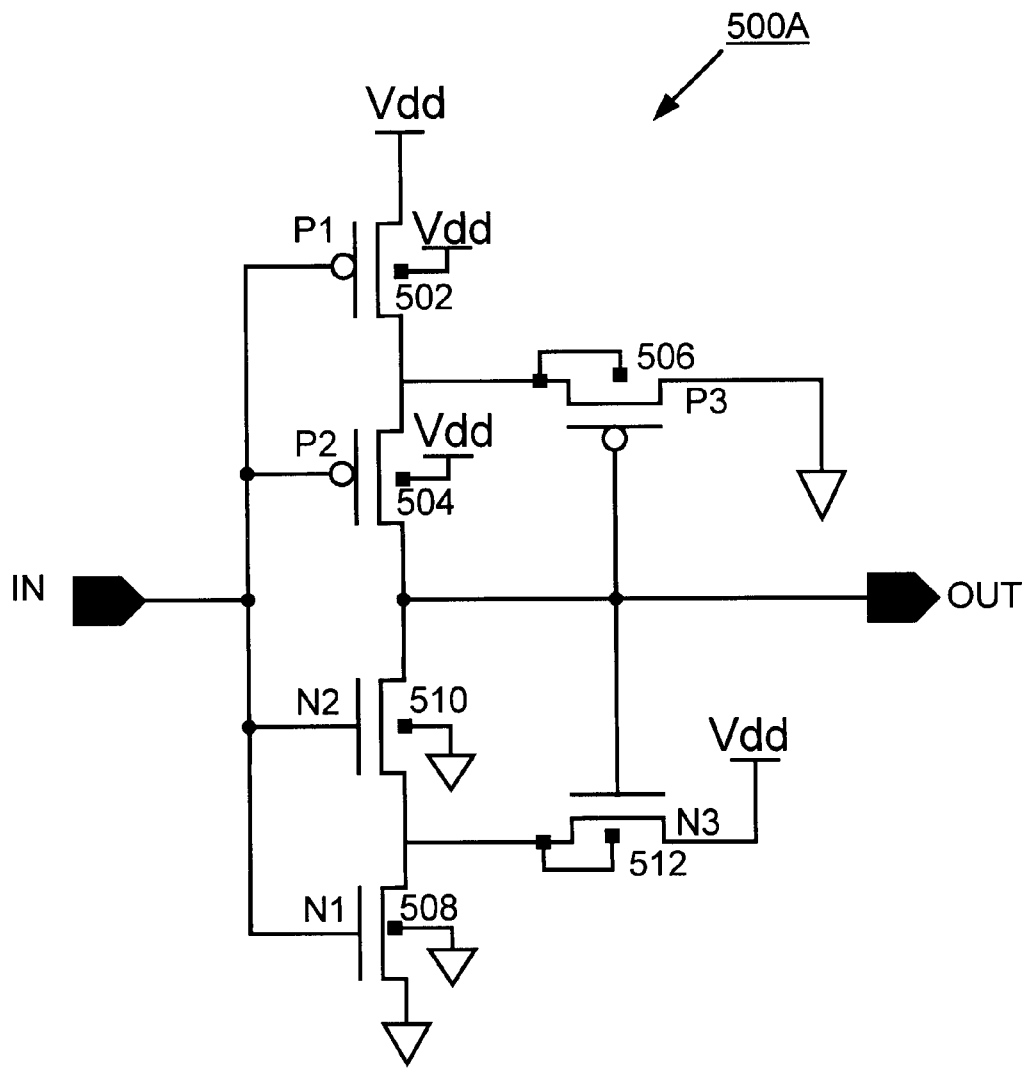
FIGS. 5A and 5B are schematic diagram representations illustrating additional exemplary SOI CMOS Schmitt trigger circuits in accordance with the preferred embodiment.
Figure 5B:
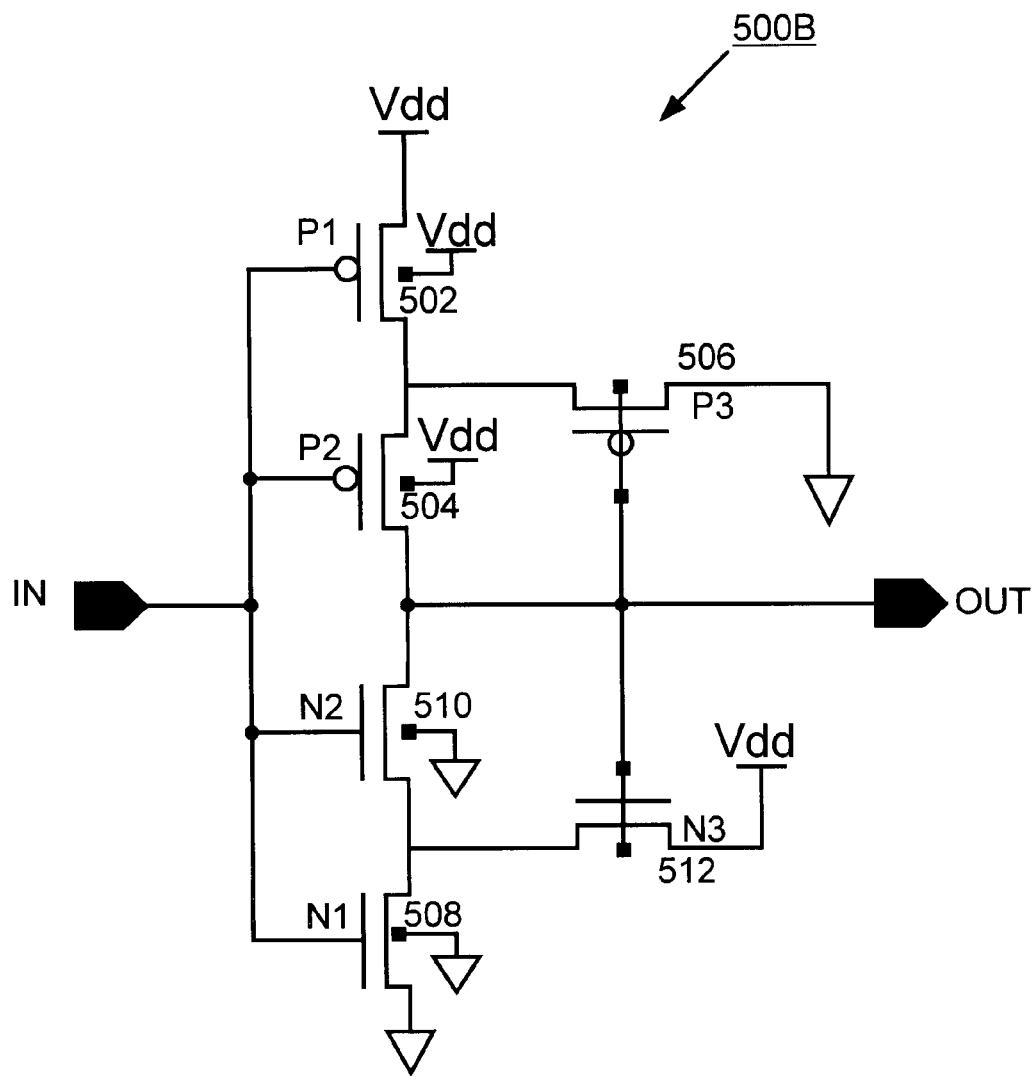

FIGS. 5A and 5B are schematic diagram representations illustrating additional exemplary SOI CMOS Schmitt trigger circuits generally designated by the reference character 500A and 500B, respectively, in accordance with the preferred embodiment. SOI CMOS Schmitt trigger circuits 500A and 500B, respectively include a plurality of PFETs P1, P2, P3; 502, 504, 506 and a plurality of NFETs N1, N2, N3; 508, 510, 512. In SOI CMOS Schmitt trigger circuit 500A, FET bodies of NFETs N1, N2; 508, 510 are coupled to ground, FET bodies of PFETs P1, P2, 502, 504 are coupled to a positive voltage supply Vdd and FET bodies of NFET N3, 512 and PFET P3, 506 are connected to their respective source. In SOI CMOS Schmitt trigger circuit 500B, FET bodies of NFETs N1, N2; 508, 510 are coupled to ground, FET bodies of PFETs P1, P2, 502, 504 are coupled to a positive voltage supply Vdd and FET bodies of NFET N3, 512 and PFET P3, 506 are connected to their respective gate.

Figure 6:
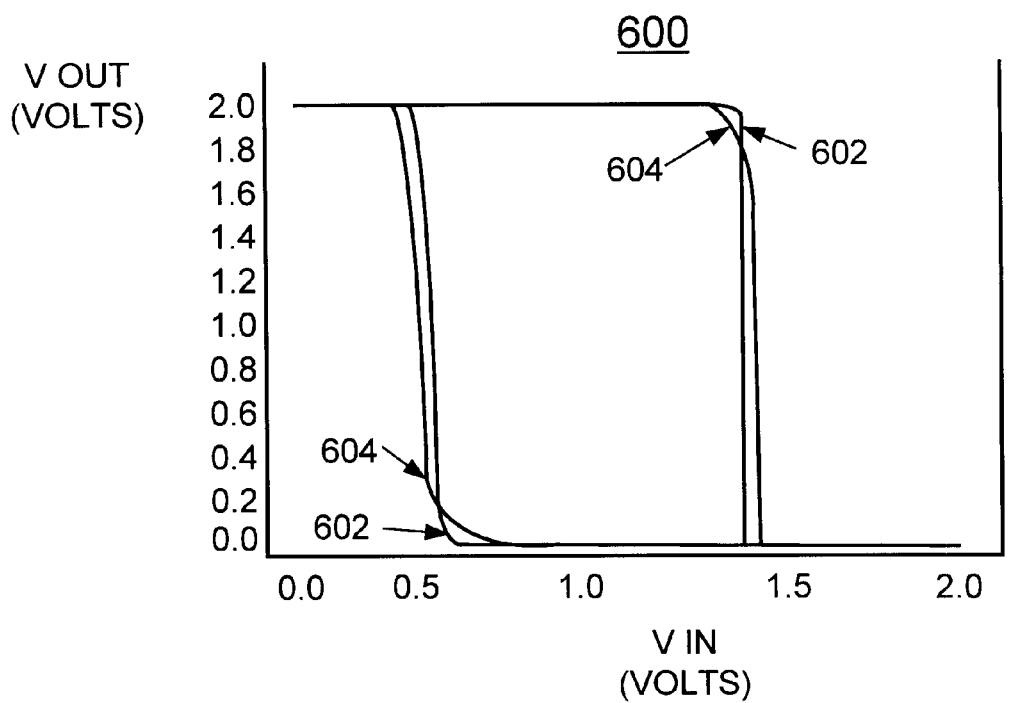
FIG. 6 is a diagram illustrating exemplary quasi-static transfer characteristics of a SOI CMOS Schmitt trigger circuits of FIGS. 5A and 5B in accordance with the preferred embodiment.

Referring also to FIG. 6, exemplary quasi-static transfer characteristics 600 of the SOI CMOS Schmitt trigger circuits 500A and 500B are shown. Connecting the FET bodies of NFET N3, 512 and PFET P3, 506 to their respective source or gate helps to increase ΔV while not losing the Vt advantage as in the SOI CMOS Schmitt trigger circuit 300A. In FIG. 6, the first 500 simulation cycles are shown when the SOI CMOS Schmitt trigger circuits 500A and 500B are activated from dormancy. The transfer curves are generated using slow input signals as done for FIGS. 2A and 2B. The configuration of FET body to source connections of SOI CMOS Schmitt trigger circuit 500A of FIG. 5A gives a sharper transfer curve generally indicated by 602 in FIG. 6. Whereas the configuration of FET body to gate connections of SOI CMOS Schmitt trigger circuit 500B of FIG. 5B gives the low Vt advantage and larger ΔV generally indicated by 604 in FIG. 6. In the circuit 500A of FIG. 5A, V⁺ equals 1.40 V, V⁻ equals 0.55 V, and ΔV equals 850 mV. In circuits 500B of FIG. 5B, V⁺ equals 1.45 V, V⁻ equals 0.50 V, and ΔV equals 950 mV. The softer switching corners of transfer curve 604 for the SOI CMOS Schmitt trigger circuit 500B of FIG. 5B are the result of substantially lowered transient Vt's of NFET N3, 512 and PFET P3, 506 with increased body voltages.

In accordance with features of the preferred embodiments, the SOI CMOS Schmitt trigger circuits 300A, 400A, 500A, 500B of FIGS. 3A, 4A, 5A, 5B are simple and convenient, providing improvements over the prior art. It is noted that undesirable hysteretic drift can occur depending upon the channels of NFET N3 and PFET P3. Undesirable hysteretic drift occurs when the channels of NFET N3 and PFET P3 are sufficiently wide to see non-negligible potential gradient along the width direction of the channel, making the body contacts less efficient. This results in the loss of a certain degree of design freedom in choosing device sizes. The undesirable hysteretic drift occurs under two conditions as follows, in advanced deep sub-micrometer SOI technologies where the FET body sheet resistance is much higher than of previous generation devices; and in large ΔV designs, where the channel widths of feedback NFET N3 and PFET P3 are made large.

In accordance with features of the preferred embodiments, a hysteresis insensitive design is provided. A successive switching threshold adjustment technique is provided. Additional successive switching threshold adjustment is achieved by successive tapping of NFET or PFET feedback devices for the V⁺ or the V⁻ trigger edges, respectively. With this arrangement, higher V⁺ and lower V⁻ are realized without using excessively wide NFET or PFET feedback devices.

Figure 7:
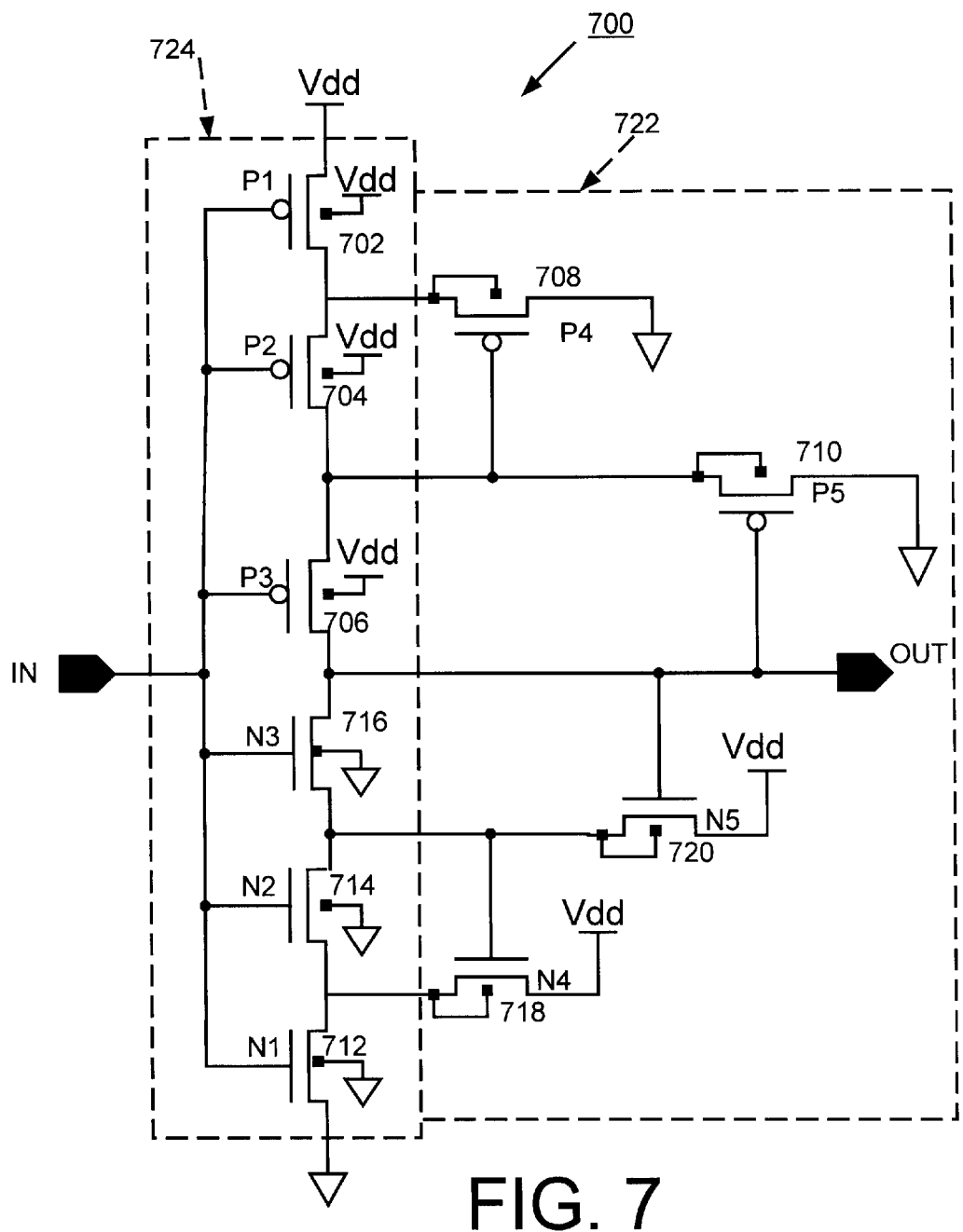
FIG. 7 is a schematic diagram representation illustrating another exemplary SOI CMOS Schmitt trigger circuit with two tiers of feedback devices for both V+ and V− trigger edges in accordance with the preferred embodiment.

FIG. 7 is a schematic diagram representation illustrating another exemplary SOI CMOS Schmitt trigger circuit generally designated by the reference character 700 in accordance with the preferred embodiment. SOI CMOS Schmitt trigger circuit 700 has two tiers of feedback devices for both V⁺ and V⁻ trigger edges. SOI CMOS Schmitt trigger circuit 700 includes a plurality of PFETs P1, P2, P3, P4, P5; 702, 704, 706, 708, 710 and a plurality of NFETs N1, N2, N3, N4, N5; 712, 714, 716, 718, 720. Threshold adjustment devices generally designated by the reference character 722 include two-layered NFET feedback devices 718, 720 and PFET feedback devices 708, 710, as shown. Rail pulling devices generally designated by the reference character 724 include PFETs P1, P2, P3; 702, 704, 706 and NFETs N1, N2, N3; 712, 714, 716. Each FET body of the two-layered NFET feedback devices N4, N5; 718, 720 and PFET feedback devices P4, P5; 708, 710 is connected to the respective FET source terminal to achieve low and predictable Vt's. It should be understood that the number of levels of NFET feedback devices and PFET feedback devices for threshold adjustment is determined by device and circuit specifications. (V⁺+V⁻)/2 needs not to center around 1/2 Vdd. It is possible to flexibly envision an asymmetric transfer curve such as in the case of Schmitt trigger receivers bordering different Vdd domains.

Figure 8:
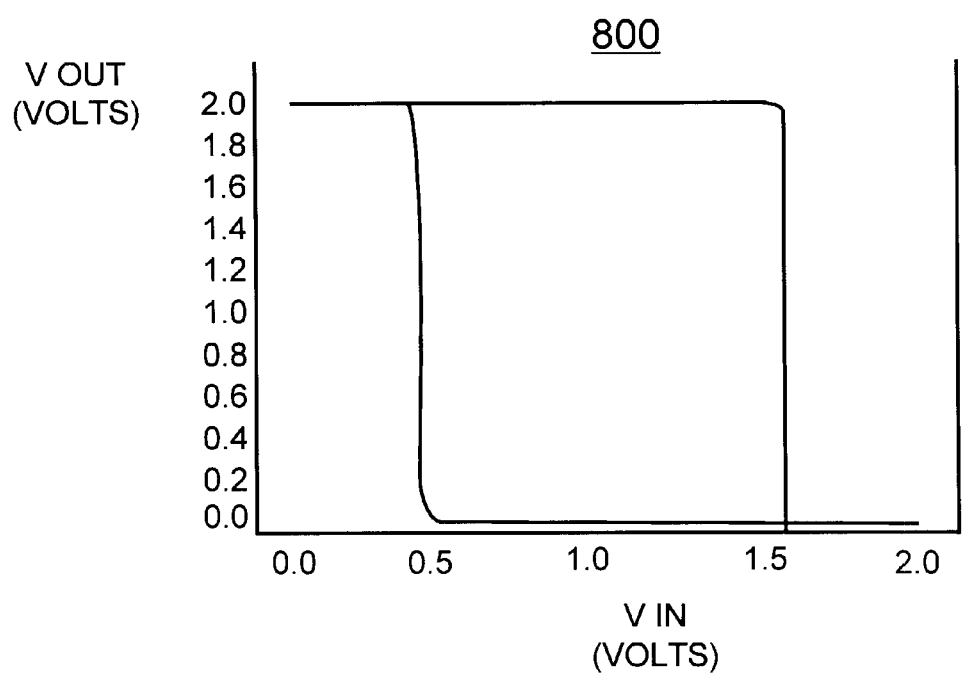
FIG. 8 is a diagram illustrating exemplary quasi-static transfer characteristics of the SOI CMOS Schmitt trigger circuit of FIG. 7 in accordance with the preferred embodiment.

FIG. 8 illustrates exemplary quasi-static transfer characteristics generally designated by the reference character 800 for the SOI CMOS Schmitt trigger circuit 700 with the two tiers feedback threshold adjustment devices NFETs and PFETs 722 in accordance with the preferred embodiment. In FIG. 8, the first 500 simulation cycles are shown when the SOI CMOS Schmitt trigger circuit 700 is activated from dormancy. The transfer curves are generated using slow input signals as done for FIGS. 2A and 2B.

Figure 9:
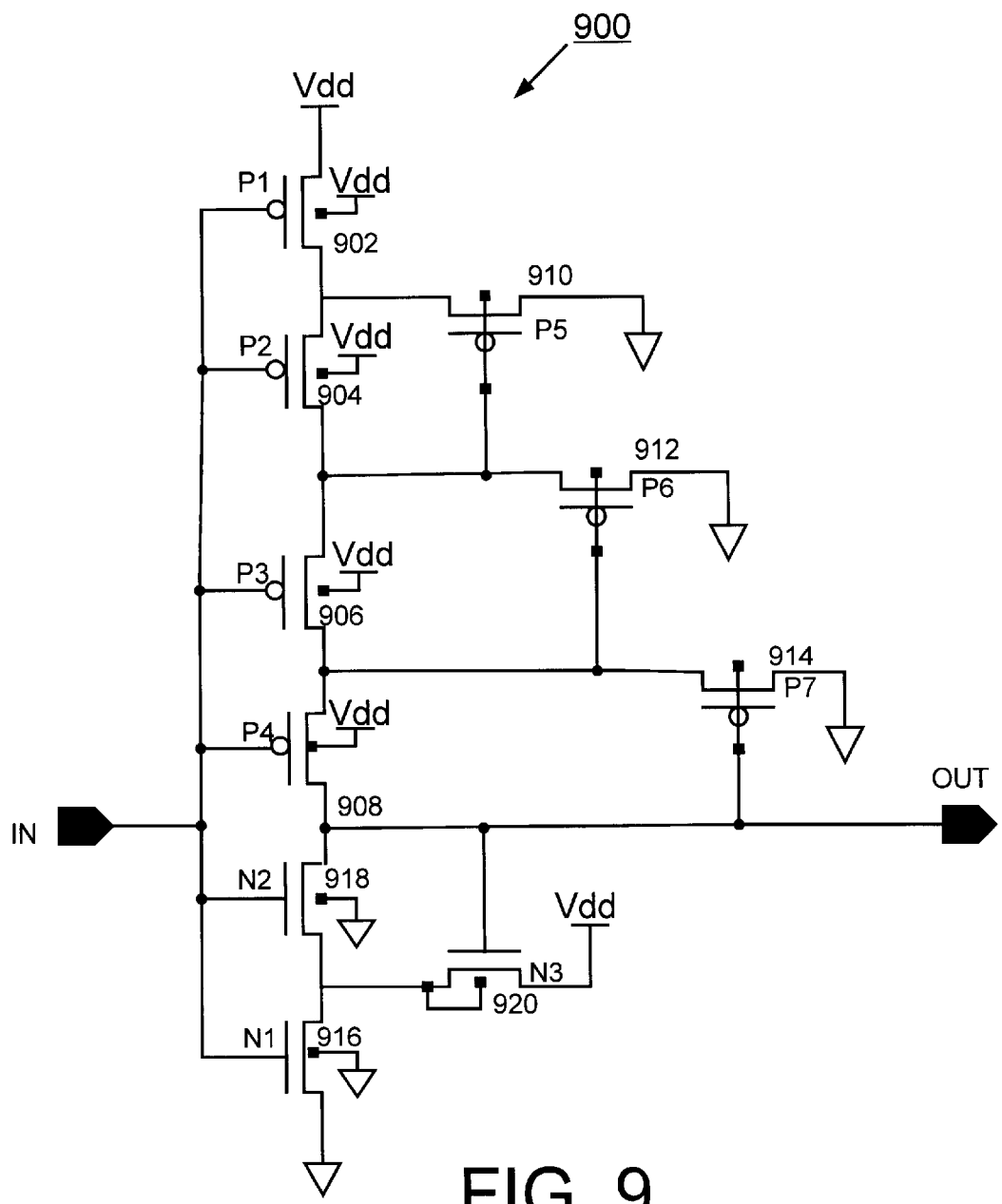
FIG. 9 is a schematic diagram representation illustrating another exemplary SOI CMOS Schmitt trigger circuit with asymmetric tiering of feedback devices for both V+ and V− trigger edges in accordance with the preferred embodiment.

FIG. 9 is a schematic diagram representation illustrating another exemplary SOI CMOS Schmitt trigger circuit generally designated by the reference character 900. SOI CMOS Schmitt trigger circuit 900 includes asymmetric tiering of feedback devices for both V⁺ and V⁻ trigger edges in accordance with the preferred embodiment. SOI CMOS Schmitt trigger circuit 900 includes a plurality of PFETs P1, P2, P3, P4, P5, P6, P7; 902, 904, 906, 908, 910, 912, 914, and a plurality of NFETs N1, N2, N3; 916, 918, 920. SOI CMOS Schmitt trigger circuit 900 includes one level of NFET feedback N3, 920 and three levels of PFET feedback P5, P6, P7; 910, 912, 914 where (V⁺+V⁻)/2 falls below 1/2 Vdd.

Figure 10A:
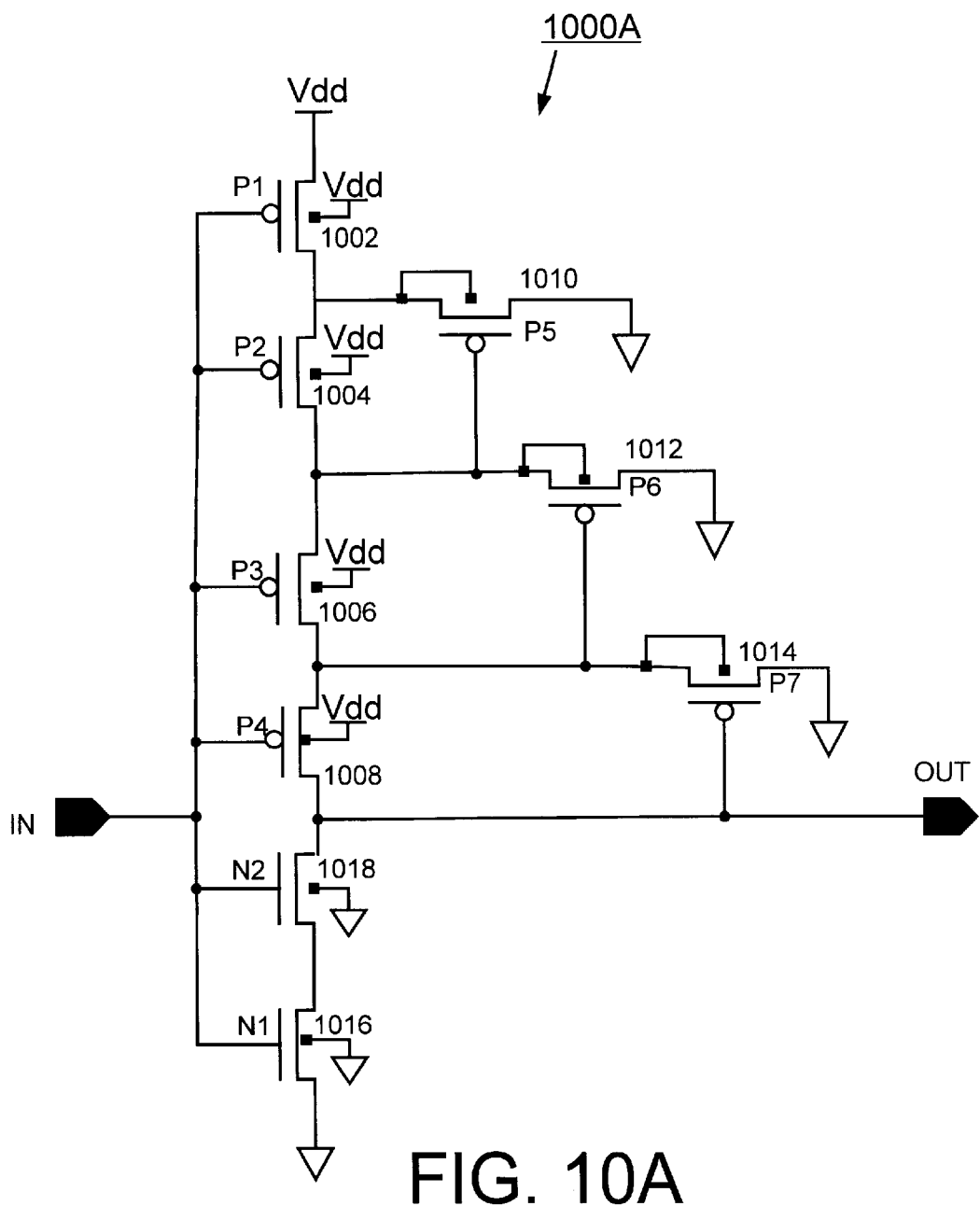
FIG. 10A is a schematic diagram representation illustrating another exemplary SOI CMOS Schmitt trigger circuit with three tiers of feedback PFETs and no feedback NFET, where the bodies of the feedback PFETs are coupled to their respective sources, in accordance with the preferred embodiment.

FIG. 10A illustrates another exemplary SOI CMOS Schmitt trigger circuit generally designated by the reference character 1000A. SOI CMOS Schmitt trigger circuit 1000A includes asymmetric tiering of feedback devices for V⁻ trigger edges with three tiers of feedback PFETs and no feedback NFET, where the bodies of the feedback PFETs are coupled to their respective sources, in accordance with the preferred embodiment. SOI CMOS Schmitt trigger circuit 1000A includes a plurality of PFETs P1, P2, P3, P4, P5, P6, P7; 1002, 1004, 1006, 1008, 1010, 1012, 1014, and a plurality of NFETs N1, N2; 1016, 1018. SOI CMOS Schmitt trigger circuit 1000 includes three tiers of PFET feedback P5, P6, P7; 1010, 1012, 1014 and no feedback NFET where (V⁺+V⁻)/2 falls below 1/2 Vdd. The FET body of each PFET feedback P5, P6, P7; 1010, 1012, 1014 is coupled to its respective source.

Figure 10B:
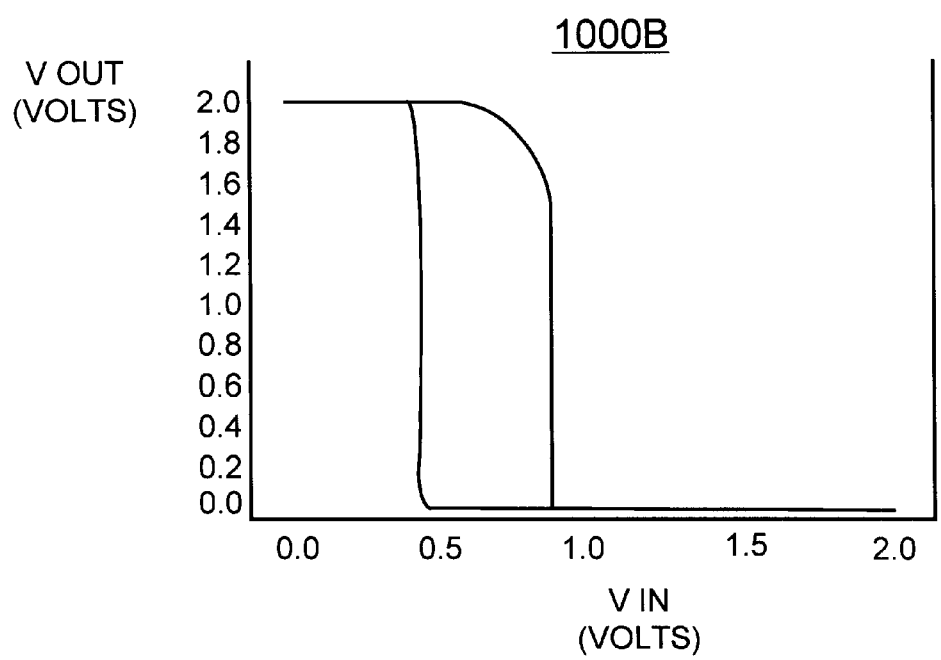
FIG. 10B is a diagram illustrating exemplary quasi-static transfer characteristics of the SOI CMOS Schmitt trigger circuit of FIG. 10A in accordance with the preferred embodiment.

FIG. 10B is a diagram illustrating exemplary quasi-static transfer characteristics generally designated by the reference character 1000B of the SOI CMOS Schmitt trigger circuit 1000A. The SOI CMOS Schmitt trigger circuit 1000A represented by quasi-static transfer characteristics 1000B can be used as the interface receiver from 1.3V to 2.0V power supply domain. The softer V⁺ corner edge is the consequence of not using any NFET feedback device to adjust switching threshold. In FIG. 10B, the first 500 simulation cycles are shown when the SOI CMOS Schmitt trigger circuit 1000A is activated from dormancy. The transfer curves are generated using slow input signals as done for FIGS. 2A and 2B.

Figure 11A:
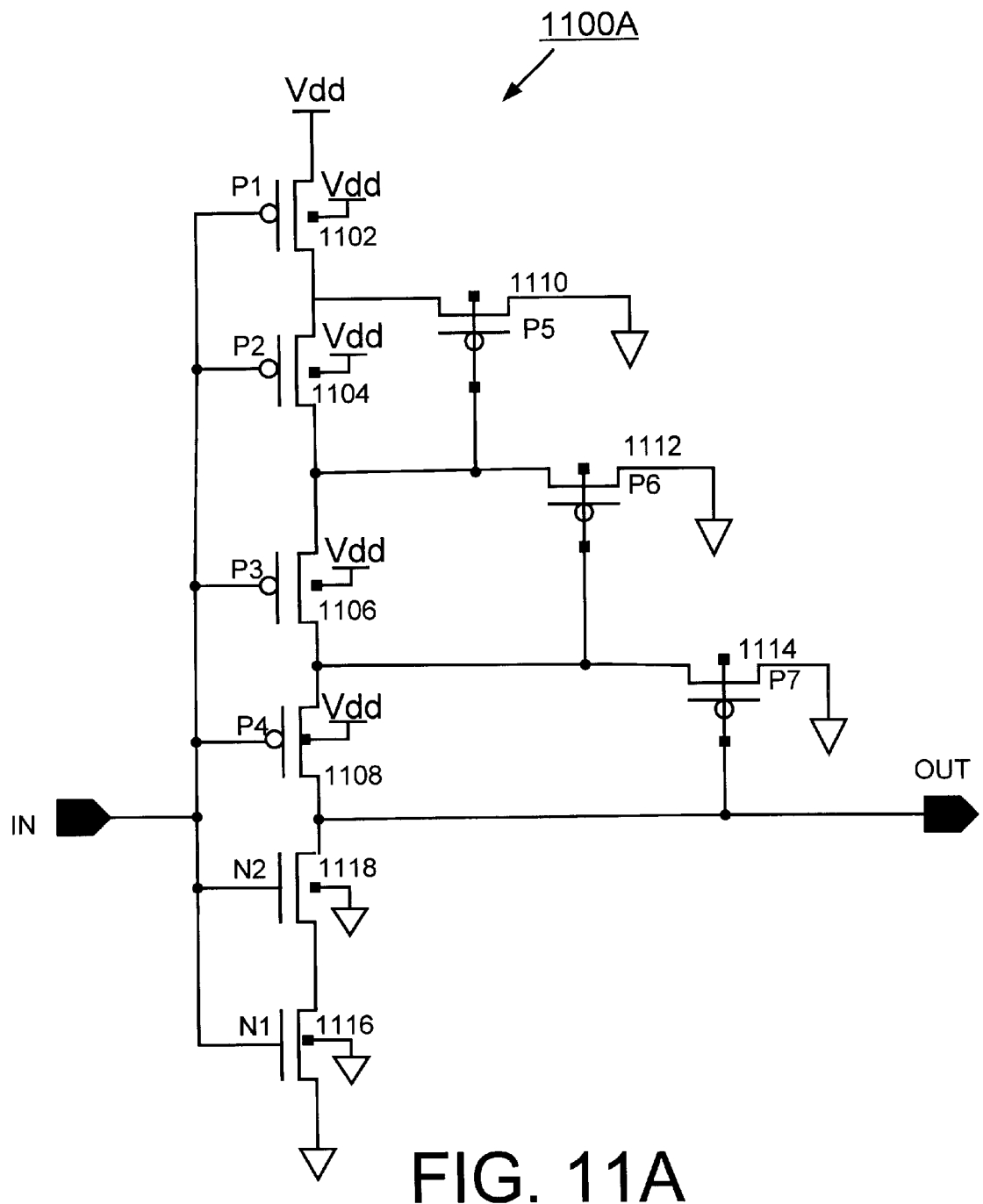
FIG. 11A is a schematic diagram representation illustrating another exemplary SOI CMOS Schmitt trigger circuit with three tiers of feedback PFETs and no feedback NFET, where the bodies of the feedback PFETs are coupled to their respective gates, in accordance with the preferred embodiment.

FIG. 11A illustrates another exemplary SOI CMOS Schmitt trigger circuit generally designated by the reference character 1100A. SOI CMOS Schmitt trigger circuit 1100A includes asymmetric tiering of feedback devices for V⁻ trigger edges with three tiers of feedback PFETs and no feedback NFET, where the bodies of the feedback PFETs are coupled to their respective gates, in accordance with the preferred embodiment. SOI CMOS Schmitt trigger circuit 1100A includes a plurality of PFETs P1, P2, P3, P4, P5, P6, P7; 1102,1104, 1106, 1108, 1110, 1112, 1114, and a plurality of NFETs N1, N2; 1116, 1118. SOI CMOS Schmitt trigger circuit 1100A includes three tiers of PFET feedback P5, P6, P7; 1110, 1112, 1114 and no feedback NFET where (V⁺+ V⁻)/2 falls below 1/2 Vdd. The FET body of each PFET feedback P5, P6, P7; 1110, 1112, 1114 is coupled to its respective gate.

Figure 11B:
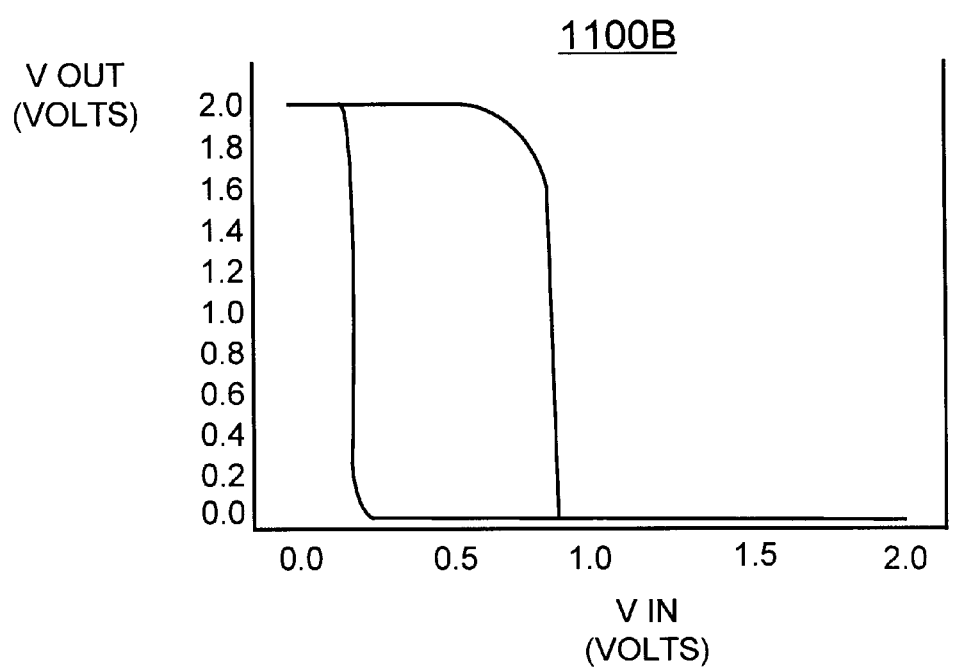
FIG. 11B is a diagram illustrating exemplary quasi-static transfer characteristics of the SOI CMOS Schmitt trigger circuit of FIG. 11A in accordance with the preferred embodiment.

FIG. 11B is a diagram illustrating exemplary quasi-static transfer characteristics generally designated by the reference character 1100B of the SOI CMOS Schmitt trigger circuit 1100A in accordance with the preferred embodiment. The SOI CMOS Schmitt trigger circuit 1100A represented by quasi-static transfer characteristics 1100B can be used as the interface receiver from 1.0V to 2.0V power supply domain. The softer V⁺ corner edge is the consequence of not using any NFET feedback device to adjust switching threshold. In FIG. 11B, the first 500 simulation cycles are shown when the SOI CMOS Schmitt trigger circuit 1100A is activated from dormancy. The transfer curves are generated using slow input signals as done for FIGS. 2A and 2B.

While the present invention has been described with reference to the details of the embodiments of the invention shown in the drawing, these details are not intended to limit the scope of the invention as claimed in the appended claims.

What is claimed is:

1. A silicon-on-insulator (SOI) complementary metal oxide semiconductor (CMOS) Schmitt trigger circuit with controllable hysteresis comprising:
   a stack of a plurality of field effect transistors (FETs) connected in series between a voltage supply and ground;
   an input applied to a gate of each of said stack of said plurality of field effect transistors (FETs);
   said stack of a plurality of field effect transistors (FETs) providing an output at a junction of a predetermined pair of said plurality of field effect transistors (FETs);
   at least one feedback field effect transistor (FET), each feedback FET having a source coupled a junction of a predefined pair of said plurality of field effect transistors (FETs) and having a gate coupled to said output; and
   a FET floating body of each of said stack of said plurality of field effect transistors (FETs) being connected to a voltage supply rail.

2. A silicon-on-insulator (SOI) complementary metal oxide semiconductor (CMOS) Schmitt trigger circuit with controllable hysteresis as recited in claim 1 wherein said stack of said plurality of field effect transistors (FETs) includes a plurality of P-channel field effect transistors (PFETs) and said FET floating body of each of said plurality of P-channel field effect transistors (PFETs) is connected to a positive voltage supply rail.

3. A silicon-on-insulator (SOI) complementary metal oxide semiconductor (CMOS) Schmitt trigger circuit with controllable hysteresis as recited in claim 1 wherein said stack of said plurality of field effect transistors (FETs) includes a plurality of N-channel field effect transistors (NFETs) and said FET floating body of each of said plurality of N-channel field effect transistors (NFETs) is connected to a voltage supply ground rail.

4. A silicon-on-insulator (SOI) complementary metal oxide semiconductor (CMOS) Schmitt trigger circuit with controllable hysteresis as recited in claim 1 wherein said at least one feedback field effect transistor (FET) includes at least one N-channel field effect transistor (NFET) and a FET floating body of said N-channel field effect transistor (NFET) is connected to a voltage supply ground potential.

5. A silicon-on-insulator (SOI) complementary metal oxide semiconductor (CMOS) Schmitt trigger circuit with controllable hysteresis as recited in claim 1 wherein said at least one feedback field effect transistor (FET) includes at least one N-channel field effect transistor (NFET) and a FET body of said NFET is connected to said gate of said NFET.

6. A silicon-on-insulator (SOI) complementary metal oxide semiconductor (CMOS) Schmitt trigger circuit with controllable hysteresis as recited in claim 1 wherein said at least one feedback field effect transistor (FET) includes at least one N-channel field effect transistor (NFET) and a FET body of said NFET is connected to said source of said NFET.

7. A silicon-on-insulator (SOI) complementary metal oxide semiconductor (CMOS) Schmitt trigger circuit with controllable hysteresis as recited in claim 1 wherein said at least one feedback field effect transistor (FET) includes at least one P-channel field effect transistor (PFET) and a FET floating body of said P-channel field effect transistor (PFET) is connected to a positive voltage supply potential.

8. A silicon-on-insulator (SOI) complementary metal oxide semiconductor (CMOS) Schmitt trigger circuit with controllable hysteresis as recited in claim 1 wherein said at least one feedback field effect transistor (FET) includes at least one P-channel field effect transistor (PFET) and a FET body of said P-channel field effect transistor (PFET) is connected to said gate of said PFET.

9. A silicon-on-insulator (SOI) complementary metal oxide semiconductor (CMOS) Schmitt trigger circuit with controllable hysteresis as recited in claim 1 wherein said at least one feedback field effect transistor (FET) includes at least one P-channel field effect transistor (PFET) and a FET body of said P-channel field effect transistor (PFET) is connected to said source of said PFET.

10. A silicon-on-insulator (SOI) complementary metal oxide semiconductor (CMOS) Schmitt trigger circuit with controllable hysteresis as recited in claim 1 wherein said at least one feedback field effect transistor (FET) includes a plurality of P-channel field effect transistors (PFETs) and a FET body of each said P-channel field effect transistor (PFET) is connected to one of said source or said gate of said PFET and at least one N-channel field effect transistor (NFET) and a FET body of each said N-channel field effect transistor (NFET) is connected to one of said source or said gate of said NFET.

11. A silicon-on-insulator (SOI) complementary metal oxide semiconductor (CMOS) Schmitt trigger circuit with controllable hysteresis as recited in claim 1 wherein said stack of said plurality of field effect transistors (FETs) includes a plurality of P-channel field effect transistors (PFETs) and a plurality of N-channel field effect transistors (NFETs); said FET floating body of each of said plurality of P-channel field effect transistors (PFETs) is connected to a positive voltage supply rail and said FET floating body of each of said plurality of N-channel field effect transistors (NFETs) is connected to a voltage supply ground rail.

12. A silicon-on-insulator (SOI) complementary metal oxide semiconductor (CMOS) Schmitt trigger circuit with controllable hysteresis comprising:
    a stack of a plurality of field effect transistors (FETs) connected in series between a voltage supply and ground;
    an input applied to a gate of each of said stack of said plurality of field effect transistors (FETs);
    said stack of a plurality of field effect transistors (FETs) providing an output at a junction of a predetermined pair of said plurality of field effect transistors (FETs);
    a FET floating body of each of said stack of said plurality of field effect transistors (FETs) being connected to a voltage supply rail; and
    at least one feedback field effect transistor (FET), said at least one feedback field effect transistor (FET) including a plurality of P-channel field effect transistors (PFETs), said plurality of feedback PFETs connected between a predefined pair of said plurality of field effect transistors (FETs) and said output; and
    each of said plurality of feedback PFETs having a source coupled to a respective junction of a respective pair of said plurality of field effect transistors (FETs) and having a gate coupled to a respective next junction of a next successive pair of said plurality of field effect transistors (FETs); said plurality of feedback PFETs for threshold adjustment of a $V^-$ switching trip point of the SOI CMOS Schmitt trigger circuit.

13. A silicon-on-insulator (SOI) complementary metal oxide semiconductor (CMOS) Schmitt trigger circuit with controllable hysteresis comprising:
    a stack of a plurality of field effect transistors (FETs) connected in series between a voltage supply and ground;
    an input applied to a gate of each of said stack of said plurality of field effect transistors (FETs);
    said stack of a plurality of field effect transistors (FETS) providing an output at a junction of a predetermined pair of said plurality of field effect transistors (FETs);
    a FET floating body of each of said stack of said plurality of field effect transistors (FETs) being connected to a voltage supply rail; and
    at least one feedback field effect transistor (FET), said at least one feedback field effect transistor (FET) including a plurality of N-channel field effect transistors (NFETs), said plurality of feedback NFETs connected between a junction of a predefined pair of said plurality of field effect transistors (FETs) and said output; and
    each of said plurality of feedback NFETs having a gate coupled to a respective junction of a respective pair of said plurality of field effect transistors (FETs) and having a source coupled to respective next junction of a respective next successive pair of said plurality of field effect transistors (FETs); said plurality of feedback NFETs for threshold adjustment of a $V^+$ switching trip point of the SOI CMOS Schmitt trigger circuit.

14. A method for adapting a CMOS Schmitt trigger circuit for deep sub-micrometer partially depleted SOI (PD/SOI) applications, the SOI CMOS Schmitt trigger circuit including a stack of a plurality of P-channel and N-channel field effect transistors (PFETs and NFETs) connected in series between a voltage supply and ground, each receiving a gate input and providing an output between a predetermined pair of the FETs; and at least one feedback FET having a source coupled a junction of a predefined pair of the plurality of field effect transistors (FETs) and having a gate coupled to the output, said method comprising the steps of:
    connecting a FET floating body of each of the PFETS in the stack to a positive voltage supply rail; and
    connecting a FET floating body of each of the NFETS in the stack to a voltage supply ground rail.

15. A method for adapting a CMOS Schmitt trigger circuit for deep sub-micrometer partially depleted SOI (PD/SOI) applications as recited in claim 14 further includes the step of connecting a FET body of said feedback FET to a gate of said feedback FET.

16. A method for adapting a CMOS Schmitt trigger circuit for deep sub-micrometer partially depleted SOI (PD/SOI) applications as recited in claim 14 further includes the step of connecting a FET body of said feedback FET to a source of said feedback FET.

17. A method for adapting a CMOS Schmitt trigger circuit for deep sub-micrometer partially depleted SOI (PD/SOI) applications as recited in claim 14 wherein the feedback FET comprises an N-channel field effect transistor (NFET) further includes the step of connecting a FET floating body of said feedback NFET to said voltage supply ground rail.

18. A method for adapting a CMOS Schmitt trigger circuit for deep sub-micrometer partially depleted SOI (PD/SOI) applications as recited in claim 14 wherein the feedback FET comprises a P-channel field effect transistor (PFET) further includes the step of connecting a FET floating body of said feedback PFET to said positive voltage supply rail.

19. A method for adapting a CMOS Schmitt trigger circuit for deep sub-micrometer partially depleted SOI (PD/SOI) applications, the SOI CMOS Schmitt trigger circuit including a stack of a plurality of P-channel and N-channel field effect transistors (PFETs and NFETs) connected in series between a voltage supply and ground, each receiving a gate input and providing an output between a predetermined pair of the FETs; and at least one feedback FET having a source coupled a junction of a predefined pair of the plurality of field effect transistors (FETs) and having a gate coupled to the output, and wherein the at least one feedback FET comprises a plurality of feedback P-channel field effect transistors (PFETs), said method comprising the steps of:
    connecting a FET body of each of the PFETS in the stack to a positive voltage supply rail;
    connecting a FET body of each of the NFETS in the stack to a voltage supply ground rail;
    connecting said plurality of feedback PFETs between said junction of said predefined pair of the plurality of field effect transistors (FETs) and said output; and
    connecting a source of each of said plurality of feedback PFETs to a respective junction of a respective pair of said plurality of field effect transistors (FETs) and connecting a gate of each of said plurality of feedback PFETs to a respective next junction of a respective next successive pair of said plurality of field effect transistors (FETs); said plurality of feedback PFETs for threshold adjustment of the $V^-$ switching trip point of the SOI CMOS Schmitt trigger circuit.

20. A method for adapting a CMOS Schmitt trigger circuit for deep sub-micrometer partially depleted SOI (PD/SOI) applications, the SOI CMOS Schmitt trigger circuit including a stack of a plurality of P-channel and N-channel field effect transistors (PFETs and NFETs) connected in series between a voltage supply and ground, each receiving a gate input and providing an output between a predetermined pair of the FETs; and at least one feedback FET having a source coupled a junction of a predefined pair of the plurality of field effect transistors (FETs) and having a gate coupled to the output, and wherein the at least one feedback FET comprises a plurality of feedback N-channel field effect transistors (NFETs), said method comprising the steps of:

connecting a FET body of each of the PFETS in the stack to a positive voltage supply rail;

connecting a FET body of each of the NFETS in the stack to a voltage supply ground rail;

connecting said plurality of feedback NFETs between said junction of said predefined pair of the plurality of field effect transistors (FETs) and said output; and connecting a gate of each of said plurality of feedback NFETs to a respective junction of a respective pair of said plurality of field effect transistors (FETs) and connecting a source of each of said plurality of feedback PFETs to a respective next junction of a respective next successive pair of said plurality of field effect transistors (FETs); said plurality of feedback NFETs for threshold adjustment of the $V^+$ switching trip point of the SOI CMOS Schmitt trigger circuit.

* * * * *